(12) United States Patent
Ginetti

(10) Patent No.: US 9,208,137 B2
(45) Date of Patent: Dec. 8, 2015

(54) METHOD TO PREVIEW AN UNDO/REDO LIST

(75) Inventor: Arnold Ginetti, Antibes (FR)

(73) Assignee: Cadence Design Systems, Inc., San Jose, CA (US)

(*) Notice: Subject to any disclaimer, the term of this patent is extended or adjusted under 35 U.S.C. 154(b) by 376 days.

(21) Appl. No.: 12/859,750

(22) Filed: Aug. 19, 2010

(65) Prior Publication Data
US 2012/0047434 A1    Feb. 23, 2012

(51) Int. Cl.
| | | |
|---|---|---|
| G06F 17/00 | (2006.01) |
| G06F 17/24 | (2006.01) |
| G06F 17/30 | (2006.01) |
| G06F 17/50 | (2006.01) |
| G06F 17/22 | (2006.01) |
| G06F 3/0481 | (2013.01) |
| G06F 9/44 | (2006.01) |

(52) U.S. Cl.
CPC .............. *G06F 17/24* (2013.01); *G06F 3/0481* (2013.01); *G06F 8/34* (2013.01); *G06F 17/2288* (2013.01); *G06F 17/241* (2013.01); *G06F 17/242* (2013.01); *G06F 17/30896* (2013.01); *G06F 17/505* (2013.01); *G06F 17/5009* (2013.01); *G06F 17/5027* (2013.01); *G06F 17/5045* (2013.01); *G06F 17/5068* (2013.01); *G06F 17/5072* (2013.01); *G06F 17/5081* (2013.01)

(58) Field of Classification Search
CPC .......... G06F 17/241; G06F 17/308969; G06F 17/2288; G06F 17/5045; G06F 17/5068; G06F 17/30896; G06F 17/242; G06F 8/34; G06F 3/0481; G06F 17/5009; G06F 17/5027; G06F 17/505; G06F 17/5072; G06F 17/5081; G06F 17/24
USPC .......... 715/229–233, 240–255, 273, 771–772, 715/783, 764, 732; 716/2–3, 5, 10; 717/10
See application file for complete search history.

(56) References Cited

U.S. PATENT DOCUMENTS

| | | |
|---|---|---|
| 5,574,846 A | 11/1996 | Yoshimura et al. |
| 5,890,181 A | 3/1999 | Selesky et al. |
| 2008/0109717 A1* | 5/2008 | Krauter .................. 715/255 |
| 2010/0281362 A1* | 11/2010 | Bailor et al. ............ 715/256 |
| 2011/0010350 A1* | 1/2011 | Bhogal et al. ........... 707/695 |
| 2011/0035727 A1* | 2/2011 | Mohamed ............... 717/110 |
| 2011/0107246 A1* | 5/2011 | Vik .......................... 715/771 |

* cited by examiner

*Primary Examiner* — Quoc A Tran
(74) *Attorney, Agent, or Firm* — Kenyon & Kenyon LLP

(57) ABSTRACT

A method identifying an element in a document corresponding to an edit selected from a list of available edits to distinguish the selected edit from the other edits in the list. The identifying may reflect the type of edit, or otherwise demonstrate the change to the element effectuated by the edit. Multiple edits may be selected and temporarily highlighted or otherwise identified in chronological order to demonstrate the effect of multiple edits on the elements of the document.

27 Claims, 7 Drawing Sheets

| Edit Entry | | | 300 |
|---|---|---|---|
| Edit Name | Edit Object | Edit Time | User ID |

FIG. 3

METHOD TO PREVIEW AN UNDO/REDO LIST

FIELD

Aspects of the present invention relate generally to the field of document editing, and more specifically to efficiently displaying the recent edit history of a document.

DESCRIPTION OF THE RELATED ART

In document editing applications, undo and redo features are commonly implemented to allow the user to undo or redo a set of earlier edits in a document. In conventional applications, the user may not be aware of how many edits have been entered and so may not know how far to 'back up'. Thus the user must repeatedly invoke the undo command to undo edits until either no more edits can be undone, or the desired edit has been undone. Often, the user may invoke the undo command until an edit that he/she did not desire to undo has been undone and may then have to invoke the redo command where available to restore the last removed edit.

In some conventional editing applications, a list of edits available for undo or redo may be displayed to the user. For example, the user may invoke a 'display edit list' feature to view a list of edits that have been implemented. The edit list may show how many edits will need to be removed to undo a particular edit. For example, in electronic design automation programs, a user may create a rectangle, then a circle, then a path, then an instance, and then a via. If the user then wants to undo everything from the created circle forward, the undo list may be displayed such that the user knows that the edits that were implemented include: created rectangle/created circle/created path/created instance/created via. In that situation, four edits should be undone to remove the created circle.

However, in an edit list, certain edits may have similar names or descriptions and thus the displayed list may be of limited use. For example, a user may create five rectangles. Then, regardless of the size or position of the created rectangles, distinguishing between which rectangles are desirable edits and which rectangles need to be undone may prove problematic when the edit list includes, for example: create rectangle/create rectangle/create rectangle/create rectangle/create rectangle.

Accordingly, there is a need to be able to distinguish among similar edits in an edit list.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

FIG. 3 illustrates an embodiment of an edit entry in an edit stack.

DETAILED DESCRIPTION

In a document editing system, such as electronic design automation programs, the edits available for undo or redo may be displayed in a visible listing accessible to the user. The current edits may be displayed such that a single edit may be selected from the list and the corresponding element in the document may be identified, for example, by highlighting to distinguish the selected edit from the other edits in the list. This may improve layout design productivity and may be a valuable tool for training a novice user by aiding understanding of the editor with a display of the effect of any specific edit.

The displayed list of edits may contain information about each edit; including edit time, edit type, or the element(s) edited by each edit. The identification of an element may reflect the type of edit, for example, by color coding the type of edit, or may otherwise demonstrate the change effectuated by the edit. Multiple edits may be selected and temporarily highlighted or otherwise identified in temporal order to demonstrate the effect of multiple edits on the elements of the document.

Figure 1:
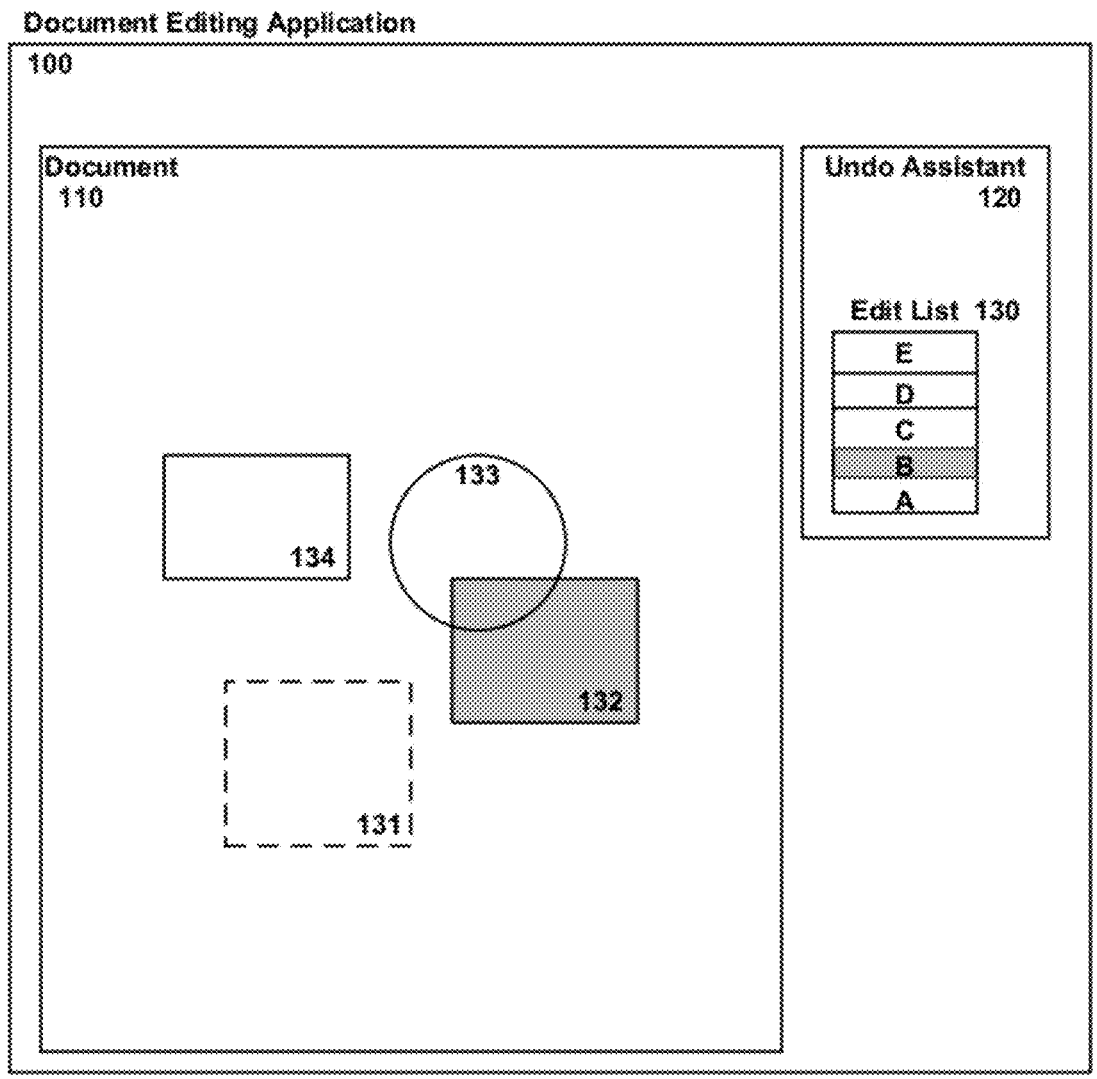
FIG. 1 is a simplified block diagram illustrating a document editing application that implements an embodiment of an edit stack preview.

FIG. 1 is a simplified block diagram illustrating a document editing application that implements an embodiment of an edit stack preview. As shown, a document editing application 100 may include a document 110, an undo assistant 120, an edit list 130, and document elements 131-134. Document editing application 100 may be any application in which documents are created, for example, a text editor, an image editor, or an electronic design automation program. As used herein, an edit may be considered any change made to a document that may be undone with a single undo. For example, an edit may be adding or removing text, creating, deleting or moving a design element or an object, or adjusting the formatting of an object or of the document itself.

As shown in FIG. 1, in the document editing application 100, the undo assistant 120 may be a feature that previews the edit stack by displaying a list of available edits. Upon opening the document 110, the undo assistant 120 may be immediately visible. If the undo assistant 120 is not visible, the display of the undo assistant 120 may be implemented in any manner known in the art. For example, in an embodiment, the undo assistant 120 may be displayed by selecting an option in a toolbar. Additionally, the display may be accomplished with the selection of a series of keyboard shortcuts. In yet another embodiment, the undo assistant 120 may be displayed by selecting an element in the document 110 and upon the pop-up of a list of options, selecting the undo assistant feature.

When the undo assistant 120 is displayed, a list 130 of available edits may be displayed to the user. The edit list 130 may be displayed in any manner known in the art. For example, as shown in FIG. 1, the undo assistant 120 may open in a new window and display the edit list 130. In another embodiment, the undo assistant may be displayed as a toolbar in the document editing application where part of the edit list 130 may not be immediately displayed but may be accessible by a drop down box. Additionally, the edit list may not be displayed if there are no available edits to undo.

Edit list 130 may contain multiple edits. As shown in FIG. 1, edit list 130 shows edits A-E. In this example, edit A may correspond to creating rectangle 131, edit B to creating rectangle 132, edit C to creating circle 133, edit D to deleting rectangle 131 and edit E to creating rectangle 134. Then the edit list 130 may display the edits as: (E) create rectangle, (D) delete rectangle, (C) create circle, (B) create rectangle, (A) create rectangle. In this description, deleted element 131 is shown in dashed lines to show where it was, but the element still is considered to have been removed from the document 110.

The edit list 130 displayed in the undo assistant 120 may be based on an edit stack that stores edit information as edits are performed. An edit may be included in the edit list 130 if it is available for undo. Edits are available for undo if they are in the edit stack. In an embodiment, the edit stack may be cleared upon closing of an edit session (i.e. when the user exits the document 110), such that when a user later opens the document 110 to begin making additional edits, the edit list 130 is initially empty. In another embodiment, the stack may be persistent across multiple editing sessions such that when a user opens a document to begin editing, edits that were made in a previous session may initially populate the edit stack. In one embodiment, the persistence of the stack may be limited to the same user; in another embodiment, the persistence may pertain to multiple users. The total number of edits that may be stored in the edit stack at any given time may be limited. The limit on the number of edits that may be stored in the edit stack may be set, for example, by default, by the user, or may vary based on the computing resources available to the document editing application 100.

Figure 2A:
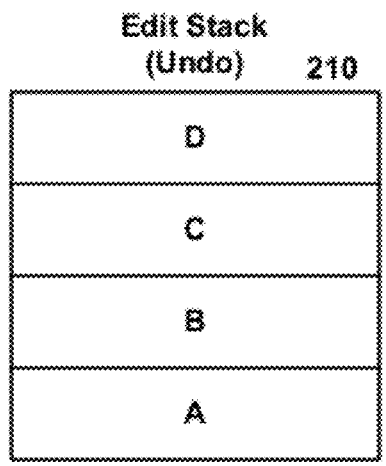
FIGS. 2A, 2B, and 2C are diagrams illustrating embodiments of an edit stack.

FIG. 2A is a diagram of one embodiment of an edit stack including edits available for undo. As a user edits a document, new edits are added to the undo edit stack 210 of FIG. 2A so that the most recent edit is at the top of the edit stack. Edits may be stored in any manner known in the art. For example, the edits may be entered into a database or otherwise stored in computer memory. When the stack reaches its capacity (i.e. the number of stored edits equals the limit on the total number of edits that can be saved in the stack), the edits at the bottom of the stack, i.e. the oldest edits, may be dropped from the stack.

Figure 2B:
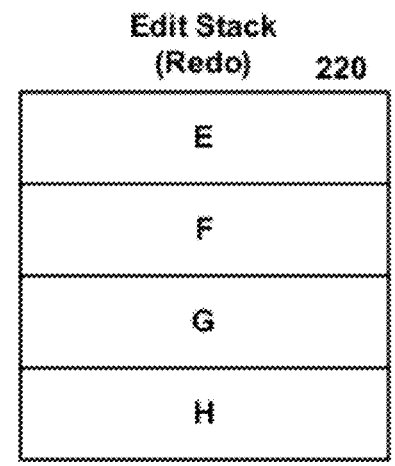

FIG. 2B is a diagram of one embodiment of an edit stack including edits available for redo. When an edit is undone, that edit may be removed from the undo edit stack 210 and added to the redo edit stack 220 of FIG. 2B so that the edit that was most recently undone is at the top of the redo edit stack 220. When there are no edits to be undone, or when the user begins entering completely new edits, all the edits in the redo edit stack 220, edits F-H, will not be present in the redo edit stack 220, and the redo edit stack 220 will be empty.

Figure 2C:
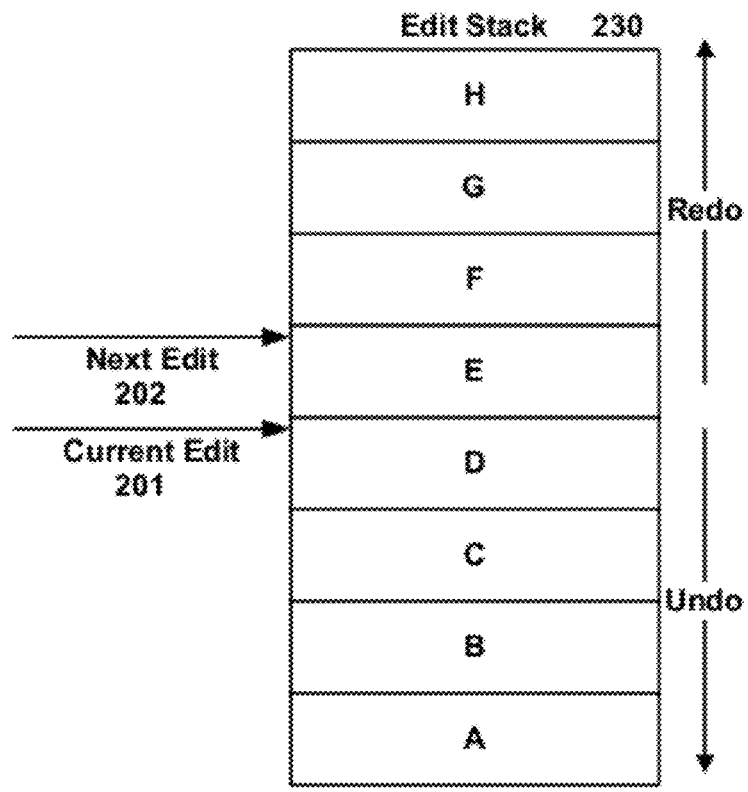

The undo edit stack 210 and redo edit stack 220 may be stored as separate stacks or they may be combined, as in FIG. 2C. FIG. 2C is a diagram of one embodiment of an edit stack 230 including edits available for both undo and redo. As shown, current edit pointer 201 may point to the top of the undo edit stack and next edit pointer 202 may point to the top of the redo edit stack. The user may undo the current edit, edit D, after which the current edit pointer 201 may shift to the next oldest edit, edit C, and the next edit pointer 202 may shift to the most recently undone edit, edit D. Then, the next undo command may undo edit C or a redo command may redo the edit at the top of the redo stack, edit D. Alternatively, the user may redo the next edit, edit E, after which the next edit pointer 202 may shift to the most recently undone edit, edit F, and the current edit pointer 201 may shift to the newly added edit, edit E. Then the next undo command may again undo edit E or a redo command may redo edit F.

FIG. 3 illustrates an embodiment of an edit entry in an edit stack. As edits are performed, the document editing application 100 may collect information about the edits. Some or all of this information may be included in an edit entry 300 and displayed in an edit list. As shown in FIG. 3, the entry information may include the type of the edit, the object that was edited, the time of the edit, and the ID of the user that made the edit. Less information may be stored in the edit entry 300, or additional information may be gathered and stored as part of the edit entry 300 as needed, for example, any other objects or elements impacted by the edit or the position of the edit in the document.

Returning to FIG. 1, if the user selects edit B from the edit list 130, corresponding rectangle 132 in the document 110 may be highlighted. The user may select an edit from the edit list 130 in any manner known in the art. For example, the user may click on the edit with a mouse, or the user may hover the mouse pointer over the edit. As another alternative, the user may select the element in the document, in which case the edit or edits corresponding to the selected element may be highlighted or otherwise identified in the edit stack 130. The overall concept here is to enable the user to see, for a given edit or edits in a document, the element or elements of the document which correspond to the edit(s). In an embodiment, the user may elect to see the effect of several edits in a row, in which case the user may select a 'demonstrate edits' feature and edits to demonstrate, for example, edits A-C. The document editing application 100 may then temporarily display and highlight individual element 131 corresponding to edit A, then automatically and temporarily highlight or otherwise identify individual element 132 corresponding to edit B, and then individual element 133 corresponding to edit C.

When an edit is selected from the edit list 130, the corresponding element in document 110 may be highlighted or otherwise identified to distinguish the selected edit from any similarly named edits in the list. An element may be identified by highlighting, by a change in the color of the element, a change in color of the lines or background of an element with a bright or otherwise noticeable color, or by other changes in appearance of the element relative to the other elements, or to the rest of the display. If the selected edit deleted an element, the selected element as implemented before the deletion may be temporarily or partially displayed in the document. If the selected edit moved an element, the selected element may be shown in the original position, the new position, or both. Similarly if the selected element was resized, the original size, the final size, or both may be shown. If the document 110 is large or complex, the display may move to or zoom into the area of the document 110 containing the selected element.

In an embodiment, edits in the edit list 130 may be color coded or otherwise distinctively identified by type of edit. For example, an edit that creates or adds to an element may be green, an edit that modifies an element may be orange, and an edit that deletes an object may be marked in red. Further, the highlighted elements may be similarly color coded. Other meaningful distinctions may be made based on the manner in which the edit is identified. Additionally, edits that move or change an element may show both the original and the moved/changed element with the aid of animation. However the selected element is identified, upon selection of an edit from the edit list 130, the nature and effect of the edit may be reflected in the document 110.

Once the user identifies the edit to be undone, the user may select the desired edit in the edit list 130 and select an 'undo to here' function such that all the subsequent edits in the list may be undone with a single command. As shown in FIG. 1, if the user has selected edit B, and the element 132 corresponding to the selected edit B has been highlighted, the user may elect to undo edit B, such that all subsequent edits are also undone, and only edit A remains. The state of the document 110 after edit B has been undone is reflected in FIG. 4. In another embodiment, the user may undo only the selected edit. Then if the user has selected edit B, and the element 132 corresponding to the selected edit B has been highlighted, the user may elect to undo only edit B, such that edit A, as well as edits C-E may remain in the edit list 130.

Figure 4:
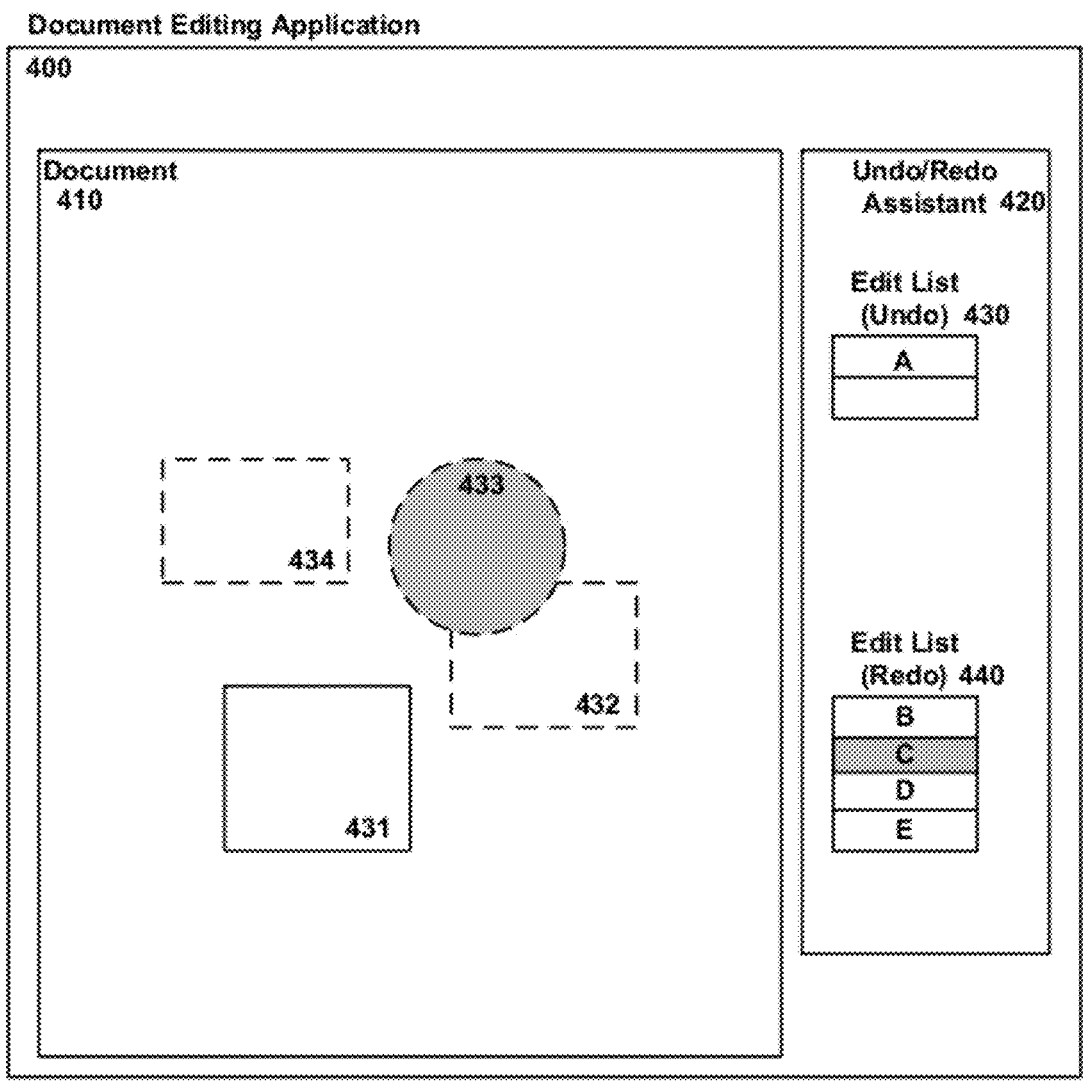
FIG. 4 is a simplified block diagram illustrating a document editing application that implements an embodiment of an edit stack preview with an undo and a redo list.

FIG. 4 is a simplified block diagram illustrating a document editing application that implements an embodiment of an edit stack preview with both an undo and a redo edit list displayed. As shown, a document editing application 400 may include a document 410, an undo/redo assistant 420, an undo edit list 430, a redo edit list 440, and document element 431. The redo edit list 440 may be automatically displayed if the undo assistant 420 is activated. Or the redo edit list 440 may be automatically displayed only when there are edits available for redo. Alternatively, the redo edit list 440 may not be automatically shown, but if the user decides to redo an undone edit, the user may invoke the redo feature and the list of edits available for redo may then be displayed. The redo edit list 440 may have the same functions and features as the undo edit list 430 indicated above.

As shown in FIG. 4, edit A remains available for undo in the undo edit list 430, and edits B-E are available for redo in the redo edit list 440. As previously described, edit A may correspond to creating rectangle 431, edit B to creating rectangle 432, edit C to creating circle 433, edit D to deleting rectangle 431 and edit E to creating rectangle 434. Then the redo edit list 440 may display the available edits as follows: (B) create rectangle, (C) create circle, (D) delete rectangle, (E) create rectangle. For the sake of clarity in FIG. 4, the elements that were removed because of an undo command, but which remain available for redo, are indicated with a dashed line despite the removed elements no longer being part of the document 410. If the user selects edit C from the redo edit list 440, corresponding removed circle 433 in the document 410 may be displayed and highlighted.

In an embodiment, when the user begins making completely new edits to the document 410, the redo edit stack may be cleared and the new edits may be added to the undo list 430. The state of the document 410 after edit B has been undone, but where new edits are implemented without redoing any edits in the redo edit list 440, is reflected in FIG. 5. In another embodiment, if the redo edit stack is not cleared, those edits may remain available for redo until the stack reaches its capacity and the oldest edits are dropped from the stack or if the stack is not persistent, until the edit session terminates.

Figure 5:
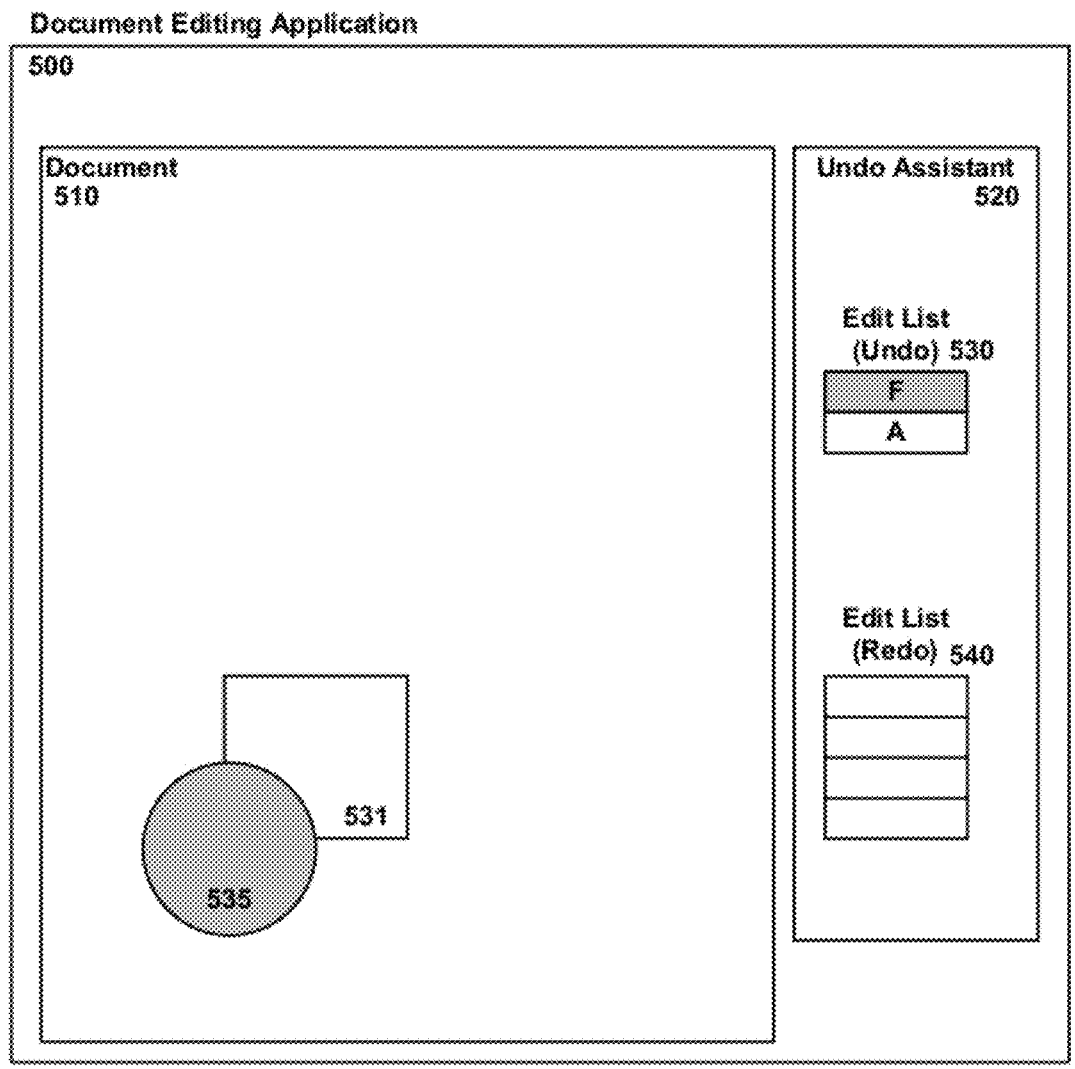
FIG. 5 is a simplified block diagram illustrating a document editing application that implements an embodiment of an edit stack preview.

FIG. 5 is a simplified block diagram illustrating a document editing application that implements an embodiment of an edit stack preview. As shown, a document editing application 500 may include a document 510, an undo assistant 520, an undo edit list 530, a redo edit list 540, and document elements 531 and 535. As previously described, edit A may correspond to creating rectangle 431, and edit F to creating circle 535. As shown in FIG. 5, edit A remains available for undo in the undo list 530, but edits B-E are no longer available for redo in the redo list 540. In this embodiment, when edits B-E are undone, they would appear in the redo edit list 540. However, when edit F is implemented, edits B-E are no longer available for redo. Consequently, it should be noted that there are no elements indicated with a dashed line because there are no elements that were deleted or removed due to an undo that remain available for undo/redo. As shown in FIG. 5, edit F has been selected by the user from the undo stack 530 and corresponding edit 535 has been highlighted.

Figure 6:
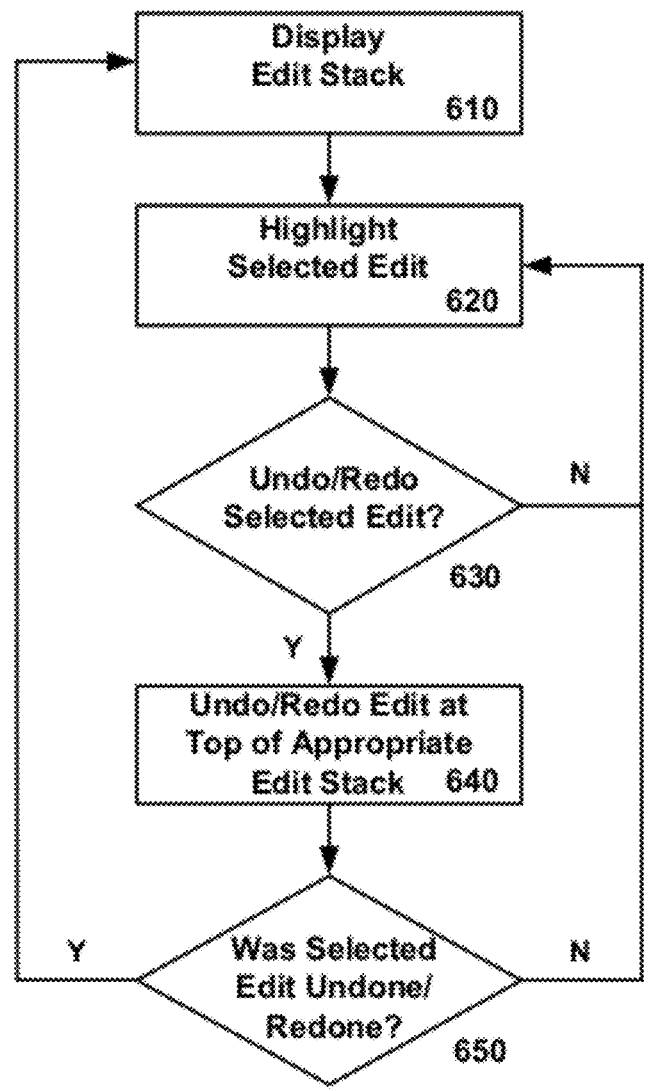
FIG. 6 is a simplified flow diagram illustrating general operation of one embodiment of a method of editing a document with a preview of the edit stack.

FIG. 6 is a simplified flow diagram illustrating general operation of one embodiment of a method of editing a document with a preview of the edit stack. At block 610, once the undo assistant is activated, the edit stack may be displayed. The edit stack may include a list of edits to undo, a list of edits to redo, or both. At block 620, upon selection of an edit from the edit stack, the selected edit may be highlighted. The selected edit may be highlighted in any manner that reflects the substance of the edit in the document. At decision block 630, the undo assistant may wait for further instruction until the user indicates that the edit should be undone, redone, or until another edit is selected. If the edit is not to be undone or redone, because another edit is selected from the stack, the newly selected edit may be highlighted at block 620. If, at decision block 630, the selected edit is to be undone or redone, the edit at the top of the edit stack may be undone or redone at block 640. At decision block 650, if the edit that was undone or redone at block 640 was not the selected edit, the next edit at the top of the edit stack may be undone or redone at block 640. If at decision block 650, the edit that was undone or redone at block 640 was the selected edit, the undo/redo may be complete and the system may display the updated edit stack at block 610.

It is noted that the arrangement of the blocks in FIG. 6 does not necessarily imply a particular order or sequence of events, nor is it intended to exclude other possibilities. For example, the operations depicted at 640 and 650 may occur substantially simultaneously with each other.

Figure 7A:
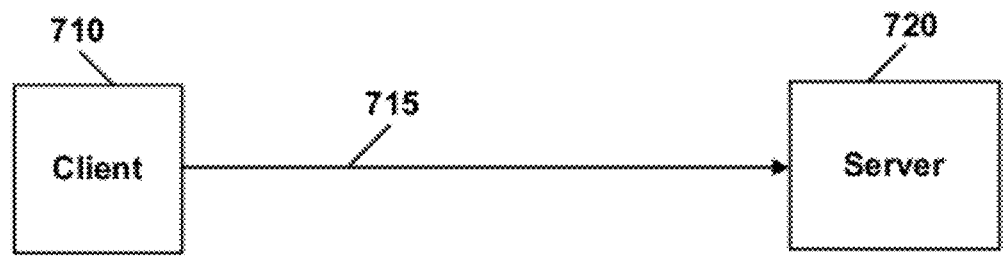
FIGS. 7A and 7B are block diagrams of hardware and hardware environments in which the present invention may operate.
Figure 7B:
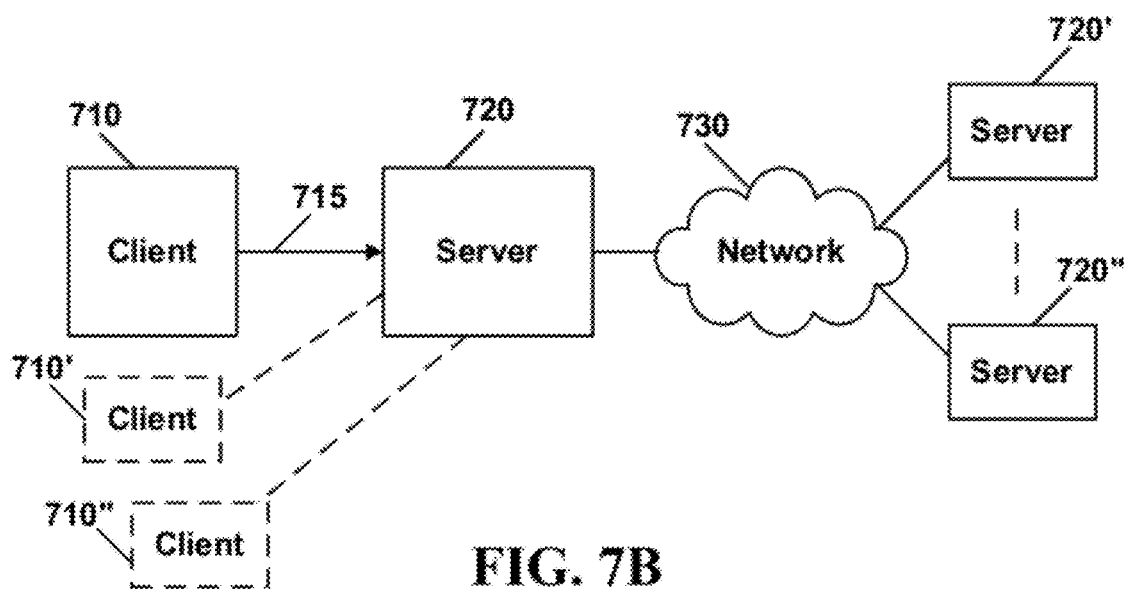

In accordance with one aspect of the invention, a user may operate the software in a client-server environment, or a stand-alone environment, or a networked environment, as would be well known to ordinarily skilled artisans. Various high level structural examples are shown in FIGS. 7A and 7B. In FIG. 7A, a user operates client machine 710 that is connected, in either wired or wireless fashion via connection 715, to server machine 720. Alternatively, client machine 710 may be a stand-alone system, as may be of particular interest where the designs being developed are highly confidential.

Server machine 720 may be stand-alone as well, with one or more clients 710, 710', 710", etc. connected to it, to provide an isolated system, again for purposes of confidentiality. Alternatively, server 720 itself may be part of a networked environment with other servers 720', 720", etc., via network 730, as shown in FIG. 7B. Network 730 itself may be a LAN, a WAN, or may be connected to other networks in any of a number of known ways, including without limitation through the Internet. In one embodiment, network 730 itself may be the Internet.

It also should be noted that embodiments of the present invention, when implemented in software, may be stored in a computer-readable medium. Such medium would be a tangible medium, such as an optical, magnetic, or magneto-optical removable medium, non-removable storage, or removable or non-removable semiconductor storage such as static random access memory (SRAM).

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A computer implemented method for editing a circuit design layout in an electronic design automation program, the method comprising:
    displaying in a first edit list a first plurality of edits to the circuit design layout, wherein the first plurality of edits are edits available for undo;
    displaying in a second edit list a second plurality of edits to the circuit design layout, wherein the second plurality of edits are edits available for redo, wherein both the first and the second edit list are displayed simultaneously;

moving an edit in the first edit list to the second edit list when an undo is conducted;

receiving a selection of an edit selected from the first edit list or the second edit list; and displaying an emphasis to at least one element in the circuit design layout affected by the selected edit, wherein said emphasis changes the appearance of the at least one element within the layout.

2. The method of claim 1 further comprising:
receiving a selection of a plurality of edits from the first edit list or the second edit list.

3. The method of claim 2 further comprising:
undoing each of the selected edits in order of edit time.

4. The method of claim 2 wherein said identifying the plurality of elements in the circuit design layout occurs individually, in order of edit time.

5. The method of claim 1 further comprising:
receiving a selection of a plurality of edits from the second edit list; and
identifying a plurality of elements in the circuit design layout corresponding to the selection.

6. The method of claim 5 further comprising:
redoing each of the selected edits in order of edit time.

7. The method of claim 5 wherein said identifying the plurality of elements in the circuit design layout occurs individually, in order of edit time.

8. The method of claim 1 wherein said displaying further comprises displaying an edit time for each edit.

9. The method of claim 1 wherein said displaying further comprises displaying an edit type for each edit, the edit type selected from the group consisting of adding, deleting, resizing, reformatting, and moving.

10. The method of claim 1 wherein said identifying reflects an edit type of the selected edit.

11. The method of claim 10 wherein said identifying is color coded according to edit type.

12. The method of claim 10 wherein said identifying demonstrates a change made to the identified element with a displayed action corresponding to the change.

13. The method of claim 1, wherein the first edit list and the second edit list are persistent across multiple document editing sessions.

14. The method of claim 1, wherein said displaying an emphasis includes displaying in the circuit design layout an element that was previously removed from the circuit design layout.

15. The method of claim 1, further comprising:
receiving a selection of an element selected from the circuit design layout; and
displaying an emphasis to at least one edit in the first edit list or the second edit list corresponding to a change to the selected element.

16. The method of claim 1 wherein said displaying an emphasis includes one of highlighting the at least one element, changing a color of the at least one element, altering the lines of the at least one element, or changing a color of the background of the at least one element.

17. The method of claim 1, wherein when the number of edits displayed in the first edit list or in the second list exceeds a threshold capacity, an oldest edit is dropped from the respective edit list.

18. The method of claim 1, further comprising:
clearing all the edits from the first edit list and the second edit list before adding a new edit to the first edit list or the second edit list.

19. A non-transitory computer-readable medium comprising instructions which, when performed by a computer, perform a method comprising:

displaying in a first edit list a first plurality of edits to a circuit design layout, wherein the first plurality of edits are edits available for undo;

displaying in a second edit list a second plurality of edits to the circuit design layout, wherein the second plurality of edits are edits available for redo, wherein both the first and the second edit list are displayed simultaneously;

moving an edit in the first edit list to the second edit list when an undo is conducted;

receiving a selection of an edit selected from the first edit list or the second edit list; and displaying an emphasis to at least one element in the circuit design layout affected by the selected edit, wherein said emphasis changes the appearance of the at least one element within the circuit design layout.

20. The non-transitory computer readable medium of claim 19, the method further comprising:
receiving a selection of an edit selected from the first edit list; and
undoing the selected edit.

21. The non-transitory computer readable medium of claim 19, the method further comprising:
receiving a selection of a plurality of edits from the first edit list;
identifying a plurality of elements in the document corresponding to the selection; and
undoing each of the selected edits in order of edit time.

22. The non-transitory computer readable medium of claim 21, wherein said identifying reflects an edit type of the first selected edit.

23. The non-transitory computer readable medium of claim 22, wherein said identifying is color coded according to edit type.

24. The non-transitory computer readable medium of claim 19, the method further comprising:
receiving a selection of an edit selected from the second edit list; and
redoing the selected edit.

25. The non-transitory computer readable medium of claim 19, the method further comprising:
receiving a selection of a plurality of edits from the second edit list; and
redoing each of the selected edits in order of edit time.

26. The non-transitory medium of claim 19, wherein the method is implemented in an electronic design automation program.

27. A system comprising:
a memory unit storing a circuit design layout;
a display device to display the circuit design layout; and
a processor executing an electronic design automation program to edit the circuit design layout by:
via the display device, displaying in a first edit list a first plurality of edits to the layout, wherein the first plurality of edits are edits available for undo;
via the display device, displaying in a second edit list a second plurality of edits to the layout, wherein the second plurality of edits are edits available for redo;
receiving a selection of an edit selected from the first edit list or the second edit list; and
via the display device, displaying an emphasis to at least one element in the layout affected by the selected edit wherein said emphasis changes the appearance of the at least one element within the layout.

* * * * *